United States Patent
Balakrishnan et al.

(10) Patent No.: US 12,154,657 B2
(45) Date of Patent: Nov. 26, 2024

(54) CHANNEL AND SUB-CHANNEL THROTTLING FOR MEMORY CONTROLLERS

(71) Applicant: Advanced Micro Devices, Inc., Santa Clara, CA (US)

(72) Inventors: Kedarnath Balakrishnan, Bangalore (IN); James R. Magro, Lakeway, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 78 days.

(21) Appl. No.: 17/853,418

(22) Filed: Jun. 29, 2022

(65) Prior Publication Data
US 2024/0005971 A1 Jan. 4, 2024

(51) Int. Cl.
| G06F 12/00 | (2006.01) |
| G11C 7/10 | (2006.01) |
| G11C 7/22 | (2006.01) |

(52) U.S. Cl.
CPC ............ *G11C 7/222* (2013.01); *G11C 7/1069* (2013.01); *G11C 7/109* (2013.01); *G11C 7/1096* (2013.01)

(58) Field of Classification Search
CPC ....... G11C 7/222; G11C 7/109; G11C 7/1096; G22C 7/1069
See application file for complete search history.

(56) References Cited

U.S. PATENT DOCUMENTS

| 11,599,184 | B2* | 3/2023 | Kontorinis | ............... G06F 1/28 |
| 2012/0072679 | A1* | 3/2012 | Biswas | ............... G06F 13/1626 |
| | | | | 711/E12.001 |
| 2013/0054901 | A1* | 2/2013 | Biswas | ............... G06F 13/1642 |
| | | | | 711/E12.001 |
| 2016/0164796 | A1* | 6/2016 | Hussain | ............. H04L 47/6215 |
| | | | | 370/232 |
| 2016/0378149 | A1* | 12/2016 | Kam | ..................... G06F 1/3206 |
| | | | | 713/320 |
| 2018/0018291 | A1* | 1/2018 | Magro | ................ G06F 13/1689 |
| 2019/0043593 | A1 | 2/2019 | Guo et al. | |

OTHER PUBLICATIONS

International Search Report and Written Opinion for International Application No. PCT/US2023/025982, mailed Oct. 16, 2023, 9 pages.

* cited by examiner

*Primary Examiner* — Min Huang
(74) *Attorney, Agent, or Firm* — Polansky & Associates, P.L.L.C.; Paul J. Polansky; Nathan H. Calvert

(57) ABSTRACT

An arbiter is operable to pick commands from a command queue for dispatch to a memory. The arbiter includes a traffic throttle circuit for mitigating excess power usage increases in coordination with one or more additional arbiters. The traffic throttle circuit includes a monitoring circuit and a throttle circuit. The monitoring circuit is for measuring a number of read and write commands picked by the arbiter and the one or more additional arbiters over a first predetermined period of time. The throttle circuit, responsive to a low activity state, limits a number of read and write commands issued by the arbiter during a second predetermined period of time.

20 Claims, 6 Drawing Sheets

CHANNEL AND SUB-CHANNEL THROTTLING FOR MEMORY CONTROLLERS

BACKGROUND

Computer systems typically use inexpensive and high density dynamic random access memory (DRAM) chips for main memory. Most DRAM chips sold today are compatible with various double data rate (DDR) DRAM standards promulgated by the Joint Electron Devices Engineering Council (JEDEC). DDR DRAMs use conventional DRAM memory cell arrays with high-speed access circuits to achieve high transfer rates and to improve the utilization of the memory bus. A DDR memory controller may interface with multiple DDR channels in order to accommodate more DRAM modules, and to exchange data with the memory faster than using a single channel. Further, modern server systems often include multiple memory controllers in a single data processor. For example, some modern server processors include eight or twelve memory controllers each connected to a respective DDR channel.

The traffic over a memory channel is sometimes throttled or slowed down to save power. Such throttling takes place over a relatively long period of time relative to the memory clock speed, and is accomplished by adjusting the memory clock and/or the memory controller clock, for example. Traffic over a memory channel is often "bursty", that is it may have idle periods or periods of low traffic followed by periods of high traffic. Memory controllers may also be placed in low power modes where they do not issue commands to memory, and then begin issuing commands when the lower power mode ends. Especially when multiple memory controllers are involved, such sudden increases in traffic can causes deleterious spikes in the current consumed by memory controller and memory channel circuitry. These spikes can happen in a relatively short time period compared to the memory clock speed.

Figure 1:
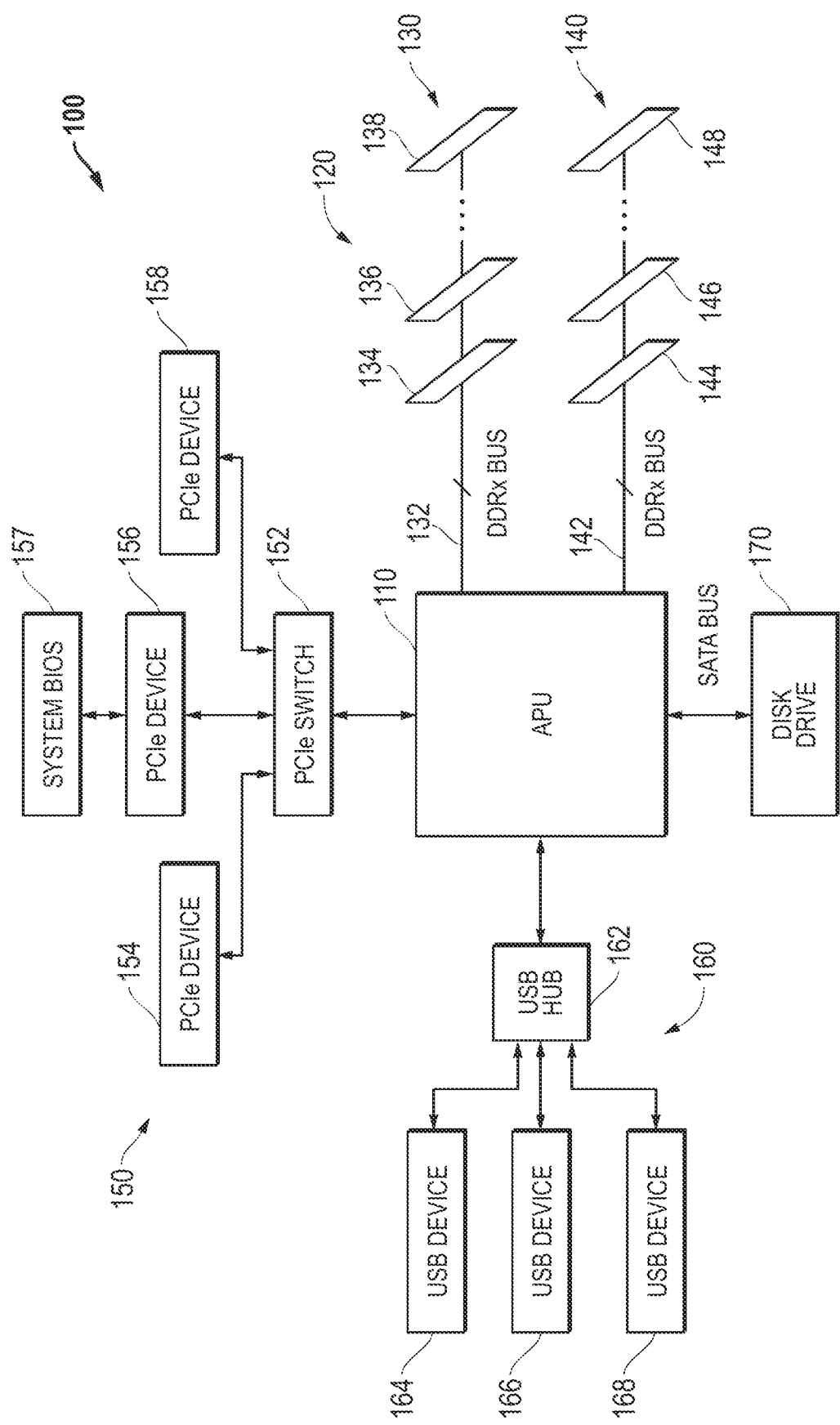
FIG. 1 illustrates in block diagram form a data processing system 100 according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller is operable to pick commands from a command queue for dispatch to a memory. The memory controller includes an arbiter and a traffic throttle circuit for mitigating excess power usage increases in coordination with one or more additional arbiters. The traffic throttle circuit includes a monitoring circuit and a throttle circuit. The monitoring circuit is for measuring a number of read and write commands picked by the arbiter and the one or more additional arbiters over a first predetermined period of time. The throttle circuit, responsive to a low activity state related to read and write commands, limits a number of read and write commands issued by the arbiter during a second predetermined period of time.

A method mitigates excess power usage increases at an arbiter in coordination with one or more additional arbiters. The method includes measuring a number of read and write commands picked by the arbiter and one or more additional arbiters over a first predetermined period of time. Responsive to a low activity state related to read and write commands, the method includes limiting a number of read and write commands issued by the arbiter during a second predetermined period of time.

A processing system includes a data processor, and a plurality of memory channels connecting the data processor to a memory. A memory controller is operable to pick commands from a command queue for dispatch to the memory for one of the memory channels. The memory controller includes an arbiter and a traffic throttle circuit for mitigating excess power usage increases in coordination with one or more additional arbiters for respective ones of the memory channels. The traffic throttle circuit includes a monitoring circuit and a throttle circuit. The monitoring circuit measures a number of read and write commands picked by the arbiter and the one or more additional arbiters over a first predetermined period of time. The throttle circuit is connected to the monitoring circuit and the arbiter, the throttle circuit, responsive to a low activity state related to read and write commands, limiting a number of read and write commands issued by the arbiter during a second predetermined period of time.

FIG. 1 illustrates in block diagram form a data processing system 100 according to the prior art. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks.

Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (GDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
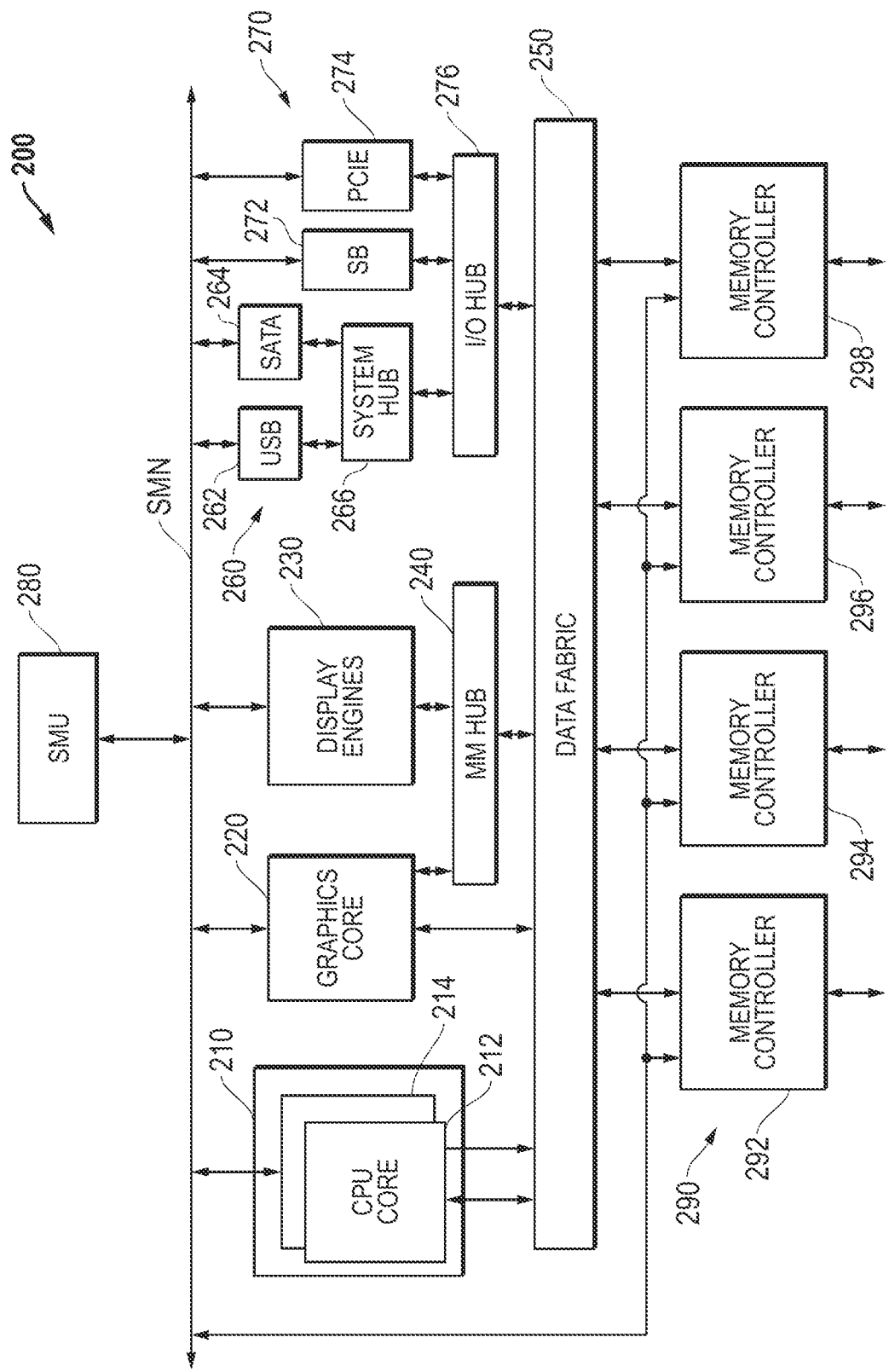
FIG. 2 illustrates in block diagram form an APU suitable for use in data processing system 100 of FIG. 1.

FIG. 2 illustrates in block diagram form an APU 200 suitable for use in data processing system like system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex 210 can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

Set of memory controllers 290 includes, in this implementation, memory controllers 292, 294, 296, and 298. Each memory controller has an upstream bidirectional connection to data fabric 250 and a downstream connection to a memory channel for accessing a memory such as a DDR memory, as further described below.

Figure 3:
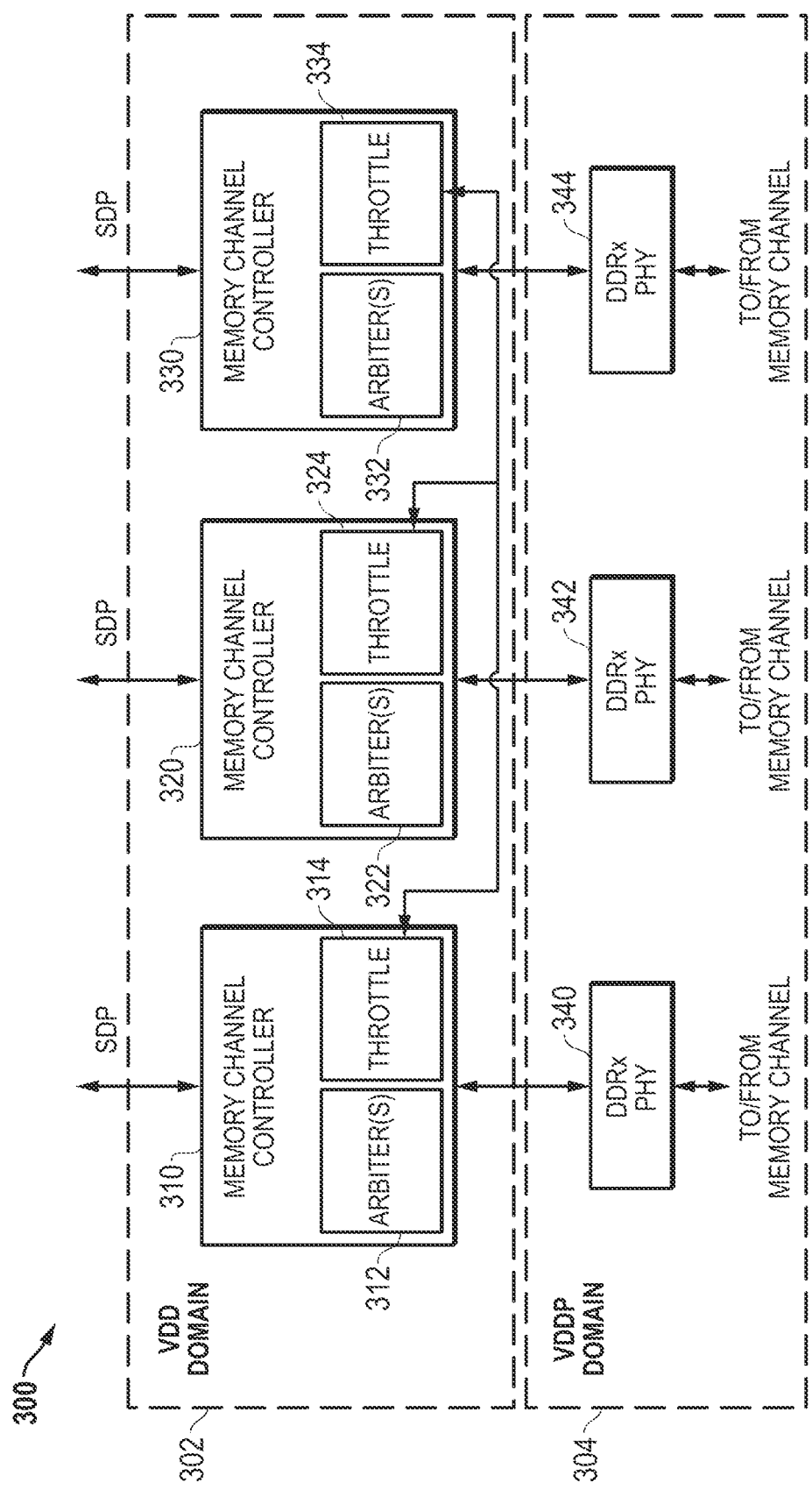
FIG. 3 illustrates in block diagram form a memory system including multiple memory controllers according to some embodiments.

FIG. 3 illustrates in block diagram form a memory system 300 including multiple memory controllers according to some embodiments. Memory system 300 is generally embodied on an integrated circuit such as an APU, GPU, or CPU system-on-chip like that of FIG. 2. Memory system 300 includes memory controllers 310, 320, and 330, and a DDR PHY interfaces 340, 342 and 344 for interfacing with one or more external memory modules. Memory system 300 also generally includes a power distribution network (PDN) including a first power domain 302 labelled "VDD DOMAIN" in which circuits are supplied from a voltage VDD, and a second power domain 304 labelled "VDDP DOMAIN" in which circuits are supplied by a voltage VDDP. While three memory controllers are shown, in most implementations in modern server systems, a system-on-chip can have many more DDR channels with more memory controllers, such as twelve, sixteen, or more. In some implementations, such memory controllers are arranged in "quadrants" in which a group of memory controllers coordinate throttling among the group. Memory controllers 310, 320, and 330 constitute such a group in this implementation.

Memory channel controllers 310, 320, and 330 are generally supplied in first power domain 302, and may include lower level domains, under first power domain 302 in the PDN, specific to each memory controller. Similarly, DDR PHY interfaces 340, 342, and 344 are generally supplied in second power domain 304, and may include lower level domains, under second power domain 304 in the PDN, specific to each DDR PHY interface. Generally, in operation, memory channel controllers 310, 320, and 330 handle a variety of traffic loads which exhibit "bursty" behavior in which memory channel controllers are idle and then quickly become busy fulfilling memory access requests. Such behavior tends to cause voltage droops in one or both of the VDDP domain 304 and the VDD domain 302. In particular, voltage droops on the order of nanoseconds (10-20 nanoseconds) tend to result when all memory controllers in a quadrant ramp up around the same time from an idle to start sending read (RD) and write (WR) commands at their full bandwidth capacity.

Each memory channel controller includes a respective one or more arbiters 312, 322, and 332 and a respective traffic throttling circuit 314, 324, and 334. Each traffic throttling circuit is bidirectionally connected to the other traffic throttling circuits for mitigating excess power usage increases in coordination with the arbiters of the other memory controllers. In this implementation, each traffic throttle circuit 314, 324, and 334 includes a monitoring circuit for measuring a number of read and write commands picked by its respective arbiter and the other arbiters over a first predetermined period of time, and a throttle circuit coupled to the monitoring circuit and the respective arbiter. Each throttle circuit, responsive to a low activity state related to read and write commands, acts to limit a number of read and write commands issued by the arbiter during a second predetermined period of time, which may be repeated as further described below.

Figure 4:
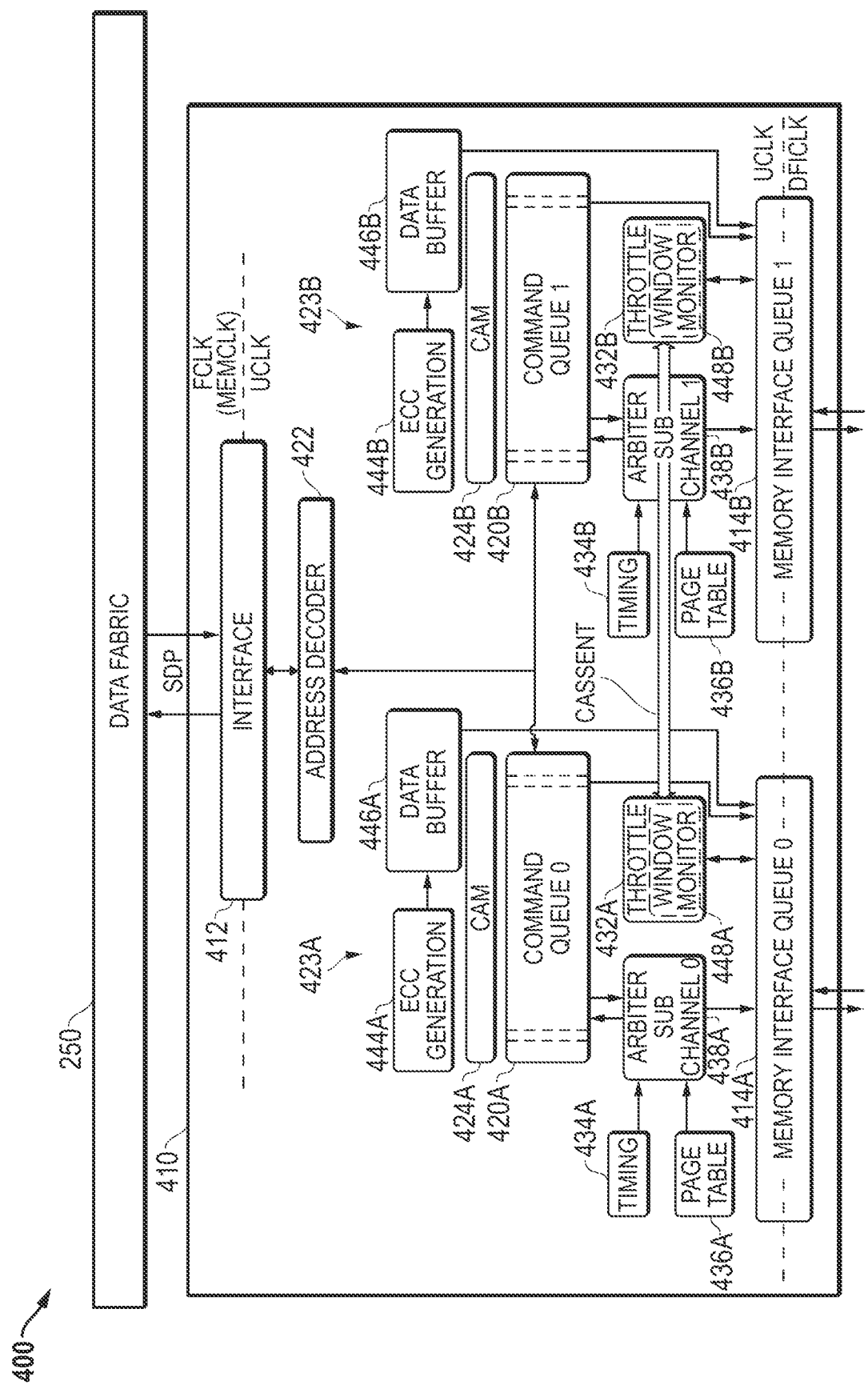
FIG. 4 illustrates in block diagram form a partial data processing system including a dual-channel memory controller that is suitable for use in an APU like that of FIG. 2.

FIG. 4 illustrates in block diagram form a partial data processing system 400 including a dual-channel memory controller 410 that is suitable for use in an APU like that of FIG. 2. Depicted is a dual-channel memory controller 410 connected to data fabric 250, to which it can communicate with a number of memory agents present in data processing system 400. Dual channel memory controller 410 is capable of controlling two sub-channels as defined, for example, in the DDR5 specification for use with DDR5 DRAMS, or those sub-channels defined in the High Bandwidth Memory 2 (HBM2) and HBM3 standards. In some implementations, instead of two sub-channels, dual-channel memory controller 410 is capable of replacing the two separate memory channel controllers and controlling two DDRx channels together in a manner transparent to data fabric 250 and the various memory addressing agents in APU 200 such that a single memory controller interface 412 can be employed to send memory access commands and receive results. Dual-channel memory controller 410 generally includes interface 412, an address decoder 422, and two instances of memory channel control circuitry 423A and 423B each allocated to a different memory channel. Each instance of memory channel control circuitry 423A, 423B includes a memory interface queue 414A, 414B, a command queue 420A, 420B, a content addressable memory (CAM) 424A, 424B, a timing block 434A, 434B, a page table 436A, 436B, an arbiter 438A, 438B, an ECC generation block 444A, 444B, a data buffer 446A, 446B, and traffic throttle circuit 432A, 432B, including a window monitoring circuit 448A, 448B.

In other implementations, only the command queues 430A, 430B, arbiters 438A, 438B, traffic throttle circuits 432A, 432B, and memory interface queues 414A, 414B are duplicated for each memory channel or sub-channel used, with the remaining depicted circuitry being adapted for use with two channels. Further, while the depicted dual-channel memory controller 410 includes two instances of an arbiter 438A, 438B, command queue 420A, 420B, and memory interface queue 414A, 414B for controlling two memory channels or sub-channels, other embodiments may include more instances, such as three or four or more, which are employed to communicate with DRAM on three or four channels or sub-channels according to the credit management techniques herein. Further, while a dual-channel memory controller is used in this implementation, other implementations may use the throttling techniques herein with single-channel memory controllers.

Interface 412 has a first bidirectional connection to data fabric 250 over a communication bus, and a second bidirectional connection to credit control circuit 421. In this embodiment, interface 412 employs scalable data port (SDP) links for establishing several channels to communicate with data fabric 250, but other interface link standards are also suitable for use. For example, in another embodiment the communication bus is compatible with the advanced extensible interface version four specified by ARM Holdings, PLC of Cambridge, England, known as "AXI4", but can be other types of interfaces in yet other embodiments. Interface 412 translates memory access requests from a first clock domain known as the "FCLK" (or "MEMCLK") domain to a second clock domain internal to dual-channel memory controller 410 known as the "UCLK" domain. Similarly, memory interface queue 414 provides memory accesses from the UCLK domain to a "DFICLK" domain associated with the DFI interface.

Address decoder 422 has a bidirectional link to interface 412, a first output connected to a first command queue 420A (labelled "Command Queue 0"), and a second output connected to a second command queue 420B (labelled "Command Queue 1"). Address decoder 422 decodes addresses of memory access requests received over data fabric 250 through interface 412. The memory access requests include access addresses in the physical address space represented in a normalized format. Based on the access addresses, address decoder 422 selects one of the memory channels, with an associated one of command queues 420A and 420B, to handle the request. The channel selected is identified to credit control circuit 421 for each request so that credit issuance decisions may be made. Address decoder 422 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address decoder 422. Address decoder 422 uses the configuration stored in the configuration registers to translate the normalized addresses into the appropriate format. Each memory access request is loaded into the command queue 420A or 420B for the memory channel selected by address decoder 422.

Each command queue 420A, 420B is a queue of memory access requests received from the various memory accessing engines in APU 200, such as CPU cores 212 and 214 and graphics core 220. Each command queue 420A, 420B is bidirectionally connected to a respective arbiter 438A, 438B for selecting memory access requests from the command queue 420A, 420B to be issued over the associated memory channel. Each command queue 420A, 420B stores the address fields decoded by address decoder 422 as well other address information that allows the respective arbiter 438A, 438B to select memory accesses efficiently, including access type and quality of service (QoS) identifiers. Each CAM 424A, 424B includes information to enforce ordering rules, such as write after write (WAW) and read after write (RAW) ordering rules.

Arbiters 438A, 438B are each bidirectionally connected to a respective command queue 420A, 420B for selecting memory access requests to be fulfilled with appropriate commands, and bidirectionally connected to respective traffic throttling circuit 432A, 432B for receiving throttling signals. Arbiters 438A, 438B generally improve efficiency of its respective memory channel by intelligent scheduling of accesses to improve the usage of the memory bus of the memory channel. Each arbiter 438A, 438B uses a respective timing block 434A, 434B to enforce proper timing relationships by determining whether certain accesses in the respective command queue 420A, 420B are eligible for issuance based on DRAM timing parameters. Each page table 436A, 436B maintains state information about active pages in each bank and rank of the respective memory channel for its respective arbiter 438A, 438B, and is bidirectionally connected to its respective replay queue 430A, 430B. Each arbiter 438A, 438B uses the decoded address information, timing eligibility information indicated by timing block 434A, 434B, and active page information indicated by page table 436A, 436B to efficiently schedule memory accesses while observing other criteria such as quality of service (QoS) requirements. Arbiter 438A, 438B, in some embodiments, determines whether a selected command is allowed to be released based on signals from traffic throttling circuit 432A, 432B.

Each traffic throttling circuit 432A, 432B is bidirectionally connected to a respective arbiter 438A, 438B, and bidirectionally connected to one or more other traffic throttling circuits, which may be in other memory controllers. As depicted, the traffic throttling circuits 432A, 432B are bidirectionally connected to each other to provide signals labelled CAS SENT to indicate to each other when column-address strobe (CAS) commands have been sent to the memory channel. The CASSENT signals are employed in the throttling process as further described below with respect to FIGS. 5-7. Each traffic throttling circuit includes a window monitoring circuit 448A, 448B for measuring a number of read and write commands picked by its respective arbiter 438A, 438B and the one or more additional arbiters over a first predetermined period of time. Generally, as further described below, each traffic throttling circuit 432A, 432B operates to, responsive to a low activity state related to read and write commands, limit a number of read and write commands issued by the arbiter 438A, 438B during a second predetermined period of time. Each traffic throttling circuit 432A, 432B may also send an "IDLE" signal to indicate an idle condition, a period of a designated length without CAS signals dispatched, has been reached at the arbiter of the sending traffic throttling circuit. Responsive to this IDLE signal, a traffic throttling circuit 432A, 432B currently in a throttling mode adjusts its own throttle rate to allow more CAS commands to be sent.

Each error correction code (ECC) generation block 444A, 444B determines the ECC of write data to be sent to the memory. In response to write memory access requests received from interface 412, ECC generation blocks 444A, 444B compute an ECC according to the write data. Data buffers 446A, 446B store the write data and ECC for received memory access requests. Data buffers 446A, 446B output the combined write data/ECC to a respective memory interface queue 414A, 414B when a respective arbiter 438A, 438B picks the corresponding write access for dispatch to the memory channel.

Figure 5:
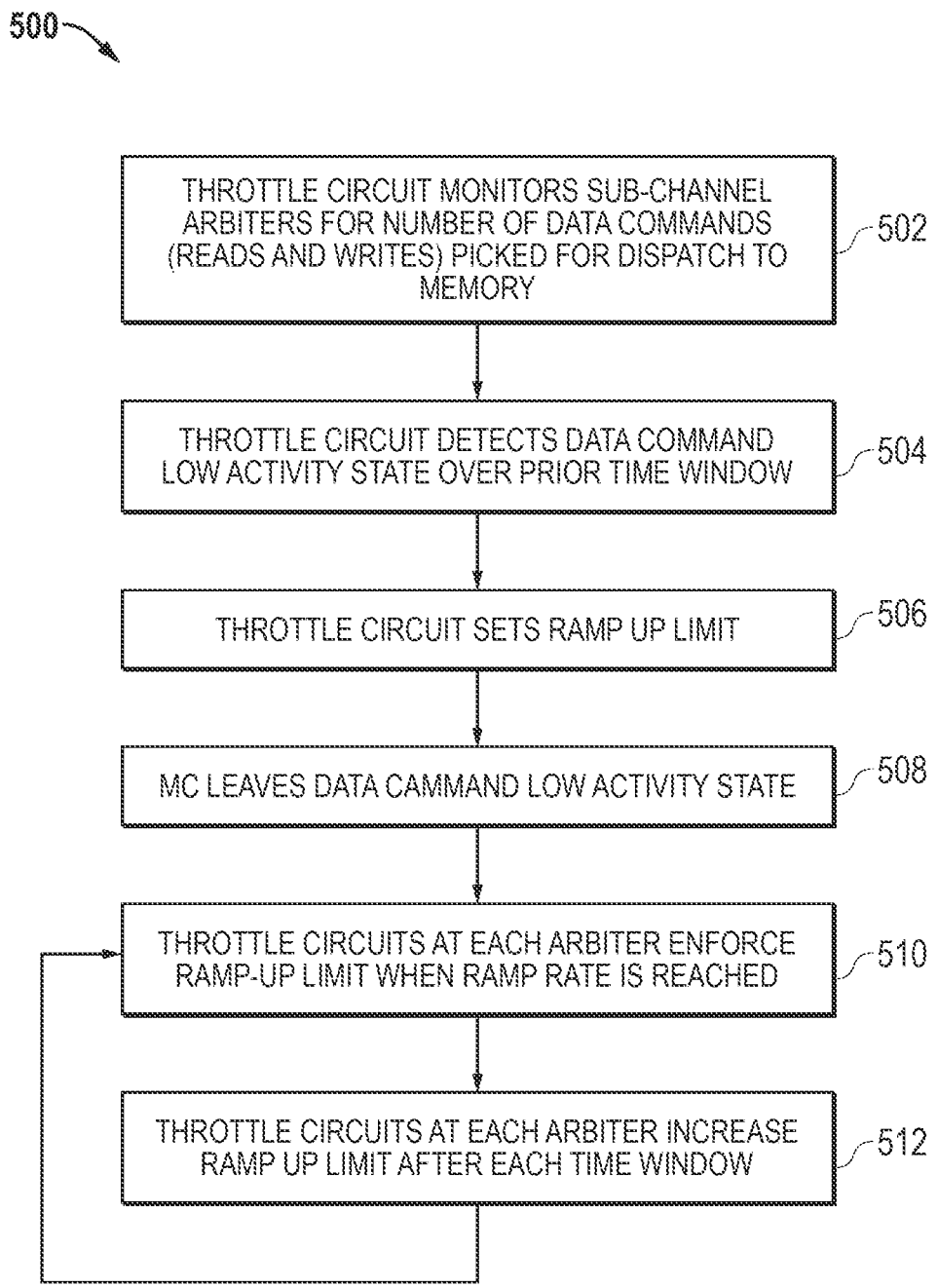
FIG. 5 is a flow diagram of another process for throttling traffic at a memory controller according to some embodiments.

FIG. 5 is a flow diagram 500 of a process for throttling traffic at a memory controller according to some embodiments. The process is suitable for use with the memory system of FIG. 3, the memory controller of FIG. 4, or other suitable systems using multiple memory channels or sub-channels and including a traffic throttling circuit such as those shown in FIG. 3, FIG. 4, or FIG. 6.

The process begins at block 502 where the traffic throttling circuit monitors a number of arbiters or sub-channel arbiters for a number of memory access commands (specifically reads and writes) picked for dispatch to memory. During such monitoring, the traffic throttling circuit detects a low activity state for data commands over a designated prior time window at block 504. The time window is measured as a configurable number of clock cycles of a memory clock, for example 64 cycles. The monitoring may occur for two sub-channels of a single memory controller, or may occur across multiple memory controllers with traffic throttling circuits linked as depicted in FIG. 3, for example. Detecting the low activity state may include detecting that no read or write commands are issued to the memory during the first period of time, or a number of commands below a designated threshold are issued during the first period of time.

Responsive to detecting the low activity state, the process at block 506 limits a number of read and write commands issued by the arbiter during a second predetermined period of time. The second period of time is also configurable as a number of memory clock cycles, for example 32. It is noted that read and write commands may be assigned different weights when monitoring. In this implementation limiting the number of commands is achieved by setting a ramp-up limit which is enforced during the time window by blocking read and write commands (specifically, CAS commands) from issuing at the arbiter or at the memory interface queue for the arbiter.

At block 508, the memory controller then leaves the low activity state and starts to dispatch memory commands. For example, this may be because the memory controller leaves an idle state, or simply that there is no command traffic to the memory controller for a period of time, and then traffic occurs. As shown at block 510, the throttle circuit at each arbiter enforces a ramp-up limit to ensure that the arbiter does not immediately increase traffic to 100% of the available bandwidth. The ramp up limit is enforced for a second window or designated period of time and is enforced at each arbiter involved in the process. When the window monitor circuit (e.g. 448A, 448B in FIG. 4, 602 in FIG. 6) determines for the current window or period of time that the ramp-up limit has been reached, the traffic throttling circuit at each arbiter throttles traffic for that respective arbiter. For example, two sub-channel arbiters collectively have a ramp up limit when the process is employed with the memory controller 410 of FIG. 4. As another example, all three memory controllers 310, 320, and 330 collectively have a ramp up limit when the process is employed with quadrant-level throttling enabled for the group of memory controllers of FIG. 3.

At block 512, the throttle circuit increases the ramp-up limit at each arbiter after the second designated period of time. Blocks 510 and 512 are then repeated until the limit reaches 100% of the available bandwidth.

For sub-channel throttling, the process is configurable using configuration settings are set in registers in the memory controller. A register setting provided to enable sub channel throttling. A register stetting is provided to specify a number of clocks cycles during which the process disallows both sub channels to send CAS simultaneously when throttle condition is met, specifying the size of the time window monitored. Another register setting is provided to specify the maximum number of clocks both channels are idle before initiating a throttle between subchannels. Another register setting provides a bandwidth increase limit for each time window monitored, setting a "ramp rate" for each time window during throttling, for example as a percentage of the total bandwidth.

Generally, the ramp-up limit sets a permissible increase in read and write commands over the second predetermined period of time, and is based on a first value held in a programmable control register. The length of the first and second periods of time are preferably based on a second value held in the programmable control register indicating a number of clock cycles.

Figure 6:
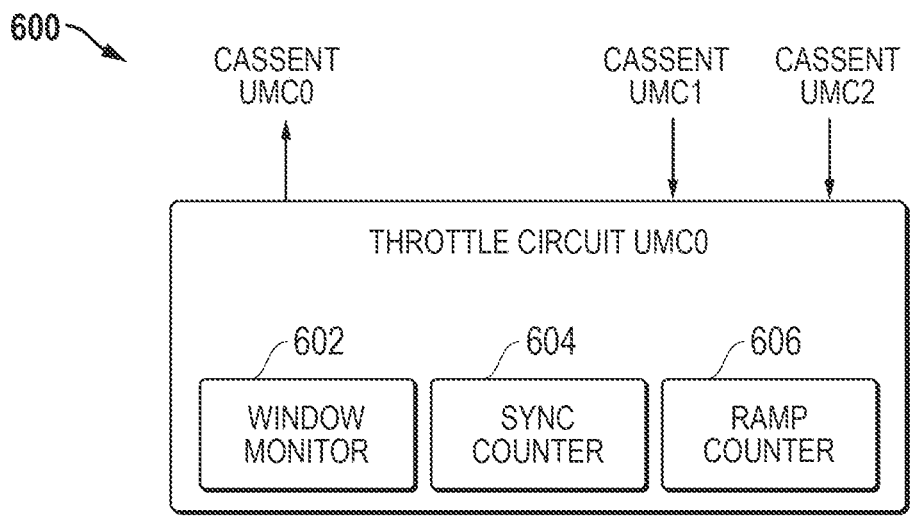
FIG. 6 illustrates in block diagram a traffic throttling circuit according to some embodiments.

FIG. 6 illustrates in block diagram a traffic throttling circuit 600 according to some embodiments. Traffic throttling circuit 600 is suitable for use in the memory system of FIG. 3, the memory controller of FIG. 4, or other suitable systems using multiple memory channels or sub-channels.

Traffic throttling circuit 600 in this example is embodied in a memory controller designated as "UMCO", which is in a group of memory controllers including two others, "DMC1" and "UMC2". Traffic throttling circuit 600 has a first input labelled "CASSENT DMC1", a second input labelled "CASSENT UMC2" an output labelled "CASSENT UMCO", and incudes a window monitoring circuit 602, a synchronization counter 604, and a ramp counter 606, and throttling logic for implementing the throttling process. Traffic throttling circuit 600 may also include a synchronization input (not shown) for coordinating synchronization counter 604 with those of other memory controllers.

The CASSENT UMCO output is used to indicate that a column-address strobe (CAS) has been dispatched by UMCO, and is fed to the traffic throttling circuits of DMC1 and UMC2, as depicted in FIG. 3, for example. The CASSENT DMC1 and CASSENT UMC2 receive similar signals from the DMC1 and UMC2. Window monitoring circuit 602 measures a number of read and write commands picked by the arbiter of UMCO and the additional arbiters DMC1 and UMC2 over a first predetermined period of time. In this implementation, the measurement is performed by counting the CAS commands dispatched at UMCO, and the CASSENT indicators received from DMC1 and UMC2 during the first period of time.

Synchronization counter 604 generally acts as a "toggle" circuit to enforce the ramp-up limit by coordinating among multiple memory controllers. In this implementation, synchronization counter 604 cycles through a count of 0, 1, and 2 with each command cycle of the memory controllers (8 clock cycles per command cycle), and directly indicates which of memory controllers UMCO, DMC1, and UMC2 is authorized to send read and write commands in each command cycle under certain conditions, as further described below. Synchronization counter may receive a synchronization signal to ensure that it is synchronized with synchronization counters at DMC1 and UMC2.

Ramp counter 606 is used to track the ramp up limit in this implementation. Ramp counter 606 is started when one of DMC1 or UMC2 sends a CAS command, as indicated by the rising edge of a CASSENT signal received from DMC1 or UMC2. In this implementation, ramp counter 606 counts down from a designated value, and employed in two different modes to delay sending of CAS commands at UMCO, as further described with respect to FIG. 7.

While this arrangement of counters and signaling is employed in some embodiments, other embodiments may, of course, achieve similar functionality using a variety of counter and timer arrangements.

Figure 7:
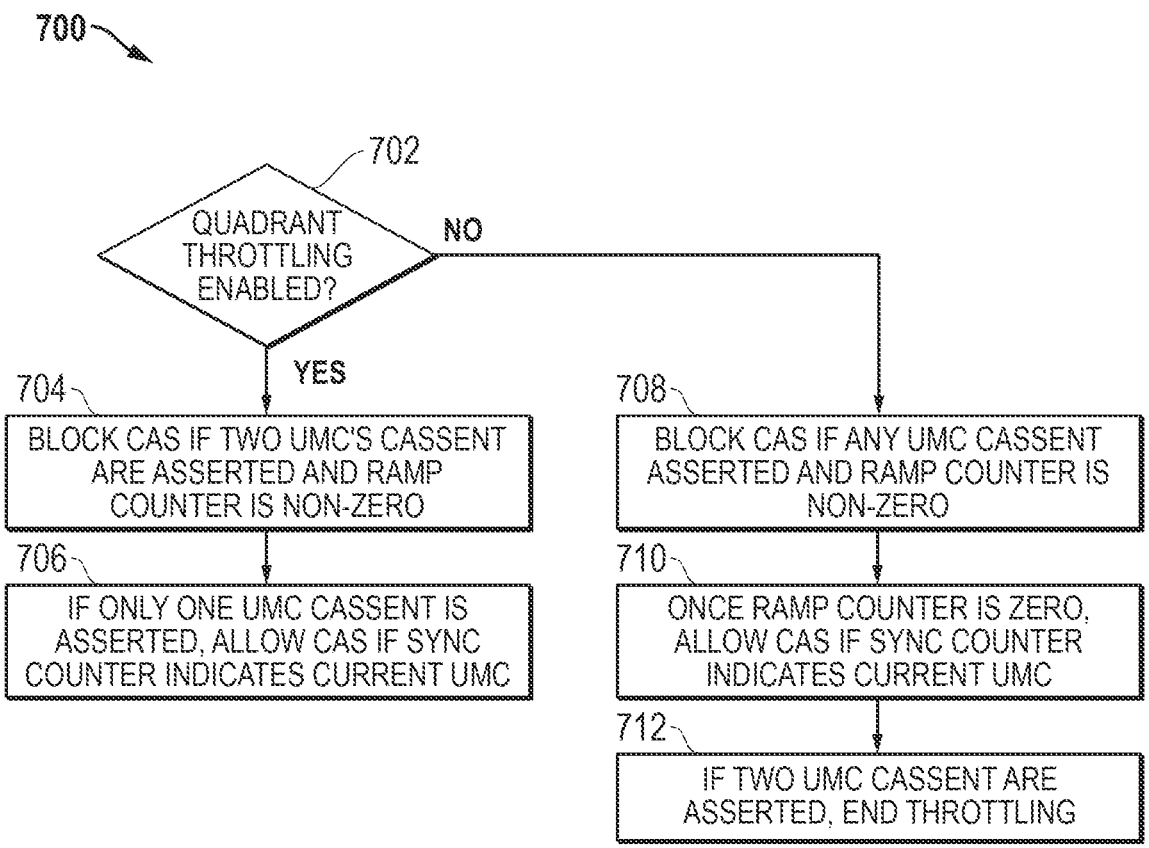
FIG. 7 is a flow diagram of another process for throttling traffic according to some embodiments.

FIG. 7 is a flow diagram 700 of another process for throttling traffic according to some embodiments. The process is suitable for use with the memory system of FIG. 3 and the traffic throttling circuit of FIG. 6, and generally provides one example method of enforcing a ramp-up limit (e.g., block 510, FIG. 5) after leaving a low-activity state at a memory controller. The process is performed at each memory controller in a group or quadrant of memory controllers. While the process steps are depicted in order, this order is not limiting, and the steps are generally performed in parallel by digital logic in traffic throttling circuit 600.

The process begins at block 702 where it determines if quadrant-level throttling is enabled, which in this implementation is determined by a bit in a configuration register. Quadrant-level throttling provides one method of coordinating a ramp-up from an idle state among multiple memory controllers such as memory controllers 310, 320, and 330 of FIG. 3.

If quadrant-level throttling is used, the process block 704 blocks as CAS command selected by the arbiter if two memory controller's (UMC's) CASSENT signals are asserted, and the ramp counter is non-zero. As discussed above the ramp counter 606 in this implementation counts down to zero provide a delay period for throttling commands.

At block 706, if only one CASSENT signal from another memory controller is asserted, the process allows a CAS to be sent from the current memory controller if synchronization counter 604 indicates the current memory controller.

If quadrant-level throttling is not enabled, the process at blocks 708-712 is used. At block 708, the process blocks a CAS command being sent from the current memory controller if any other memory controller in the group has asserted a CAS SENT signal and ramp counter 606 is non-zero. At block 710, once ramp counter 606 reaches zero, a CAS is allowed to be sent from the current memory controller if synchronization counter 604 indicates the current memory controller. At block 712, the process ends throttling and resumes normal operation of the current memory controller if two CAS SENT signals are asserted simultaneously from other memory controllers.

While this process uses a synchronization counter and a ramp counter, other processes may of course use other schemes for limiting a number of read and write commands issued by the arbiter.

Register settings are provided for configuring quadrant level throttling. A register setting is provided to enable quadrant level throttling. A register setting is provided to configure detecting an idle condition which requires throttling, containing a number of clock cycles of inactivity to consider the idle condition being activated. A ramp rate setting provides the maximum increase for each monitored window period during quadrant level throttling. A throttle length setting provides a number of clock cycles to delay the next CAS when the ramp rate is reached during a time window.

The memory system of FIG. 3, the dual-channel memory controller of FIG. 2, and the traffic throttling circuit of FIG. 6, or any portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, while a dual-channel memory controller is used as an example, the techniques herein may be also be applied to more than two memory channels to combine their capacity in a manner transparent to the data fabric and the host data processing system. For example, three or four memory channels may be controlled using the techniques herein by providing a separate command queue and memory channel control circuitry for each channel, while providing a single interface, address decoder, and credit control circuit issuing request credits to the data fabric which are independent of the individual memory channels. Furthermore, the internal architecture of dual-channel memory controller 210 may vary in different embodiments. Dual-channel memory controller 210 may interface to other types of memory besides DDRx, such as high bandwidth memory (HBM), RAMbus DRAM (RDRAM), and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A memory controller operable to pick commands for dispatch to a memory, the memory controller comprising:
   an arbiter;
   a traffic throttle circuit connected to the arbiter for mitigating excess power usage increases in coordination with one or more additional arbiters, the traffic throttle circuit comprising:
      a monitoring circuit for measuring a number of read and write commands picked by the arbiter and the one or more additional arbiters over a first predetermined period of time; and
      a throttle circuit, responsive to a low activity state, limiting a number of read and write commands issued during a second predetermined period of time.

2. The memory controller of claim 1, wherein:
   the throttle circuit further comprises a programmable control register holding a limit value indicating a permissible increase in read and write commands over the second predetermined period of time.

3. The memory controller of claim 2, wherein:
   the programmable control register further holds a value indicating the first and second predetermined periods of time as a number of clock cycles.

4. The memory controller of claim 1, wherein:
   the monitoring circuit includes one or more first inputs receiving a signal from the one or more additional arbiters, respectively, to indicate that a respective additional arbiter has sent a column-address strobe command associated with a read or write command to the memory.

5. The memory controller of claim 4, wherein:
   the monitoring circuit includes one or more second inputs receiving a second signal from the one or more additional arbiters, respectively, to indicate that the respective additional arbiter has selected a read or write command to be sent to the memory.

6. The memory controller of claim 1, wherein:
   at least one of the one or more additional arbiters is a sub-channel arbiter for dispatching commands to a sub-channel of a memory channel at least partially shared with the arbiter.

7. The memory controller of claim 1, wherein:
   at least one of the one or more additional arbiters is a channel arbiter for dispatching commands to a separate channel from that used by the arbiter.

8. The memory controller of claim 1, wherein:
   the throttle circuit includes a toggle circuit operable to indicate to the arbiter following the low activity state whether the arbiter is authorized to send read and write commands, the toggle circuit synchronized with a similar toggle circuit in the one or more additional arbiters.

9. A method of mitigating excess power usage increases at an arbiter in coordination with one or more additional arbiters, the method comprising:
   measuring a number of read and write commands picked by the arbiter and one or more additional arbiters over a first predetermined period of time; and
   responsive to a low activity state related to read and write commands, limiting a number of read and write commands issued by the arbiter for transmission to a memory during a second predetermined period of time.

10. The method of claim 9, further comprising:
    determining a permissible increase in read and write commands over the second predetermined period of time based on a first value held in a programmable control register.

11. The method of claim 10, further comprising:
    determining the first and second predetermined periods of time based on a second value held in the programmable control register indicating a number of clock cycles.

12. The method of claim 9, further comprising:
    receiving a signal from the one or more additional arbiters, respectively, to indicate that a respective additional arbiter has sent a column-address strobe command associated with a read or write command to the memory.

13. The method of claim 12, further comprising:
    receiving a second signal from the one or more additional arbiters, respectively, to indicate that the respective additional arbiter has selected a read or write command to be sent to the memory.

14. The method of claim 9, wherein:
at least one of the one or more additional arbiters is a sub-channel arbiter for dispatching commands to a sub-channel on a memory channel at least partially shared with the arbiter.

15. The method of claim 9, wherein:
at least one of the one or more additional arbiters is a channel arbiter for dispatching commands to a separate channel from that used by the arbiter.

16. The method of claim 9, further comprising:
based on a value of a toggle circuit, indicating to the arbiter following the low activity state whether the arbiter is authorized to send read and write commands; and
synchronizing the toggle circuit with a similar toggle circuit in the one or more additional arbiters.

17. A processing system comprising:
a data processor;
a plurality of memory channels coupling the data processor to a memory; and
a memory controller operable to pick commands for dispatch to the memory over a for one of the memory channels, the memory controller including an arbiter and a traffic throttle circuit for mitigating excess power usage increases in coordination with one or more additional arbiters for respective ones of the memory channels, the traffic throttle circuit comprising:
a monitoring circuit for measuring a number of read and write commands picked by the arbiter and the one or more additional arbiters over a first predetermined period of time; and
a throttle circuit, responsive to a low activity state, limiting a number of read and write commands issued during a second predetermined period of time.

18. The processing system of claim 17, wherein:
the throttle circuit further comprises a programmable control register holding a limit value indicating a permissible increase in read and write commands over the second predetermined period of time.

19. The processing system of claim 18, wherein:
the programmable control register further holds a value indicating the first and second predetermined periods of time as a number of clock cycles.

20. The processing system of claim 17, wherein:
the monitoring circuit includes one or more first inputs receiving a signal from the one or more additional arbiters, respectively, to indicate that a respective additional arbiter has sent a column-address strobe command associated with a read or write command to the memory.

* * * * *